United States Patent
Chiang

(12)
(10) Patent No.: US 6,317,066 B1
(45) Date of Patent: Nov. 13, 2001

(54) LAYOUT ARRANGEMENT OF CURRENT SOURCES IN A CURRENT-MODE DIGITAL-TO-ANALOG CONVERTER

(75) Inventor: Ming-Cheng Chiang, Hsinchu (TW)

(73) Assignee: Sunplus Technology Co., Ltd. (TW)

( * ) Notice: Subject to any disclaimer, the term of this patent is extended or adjusted under 35 U.S.C. 154(b) by 0 days.

(21) Appl. No.: 09/522,290

(22) Filed: Mar. 9, 2000

(51) Int. Cl.⁷ .................................................. H03M 1/66
(52) U.S. Cl. ............................................................ 341/144
(58) Field of Search .................................. 341/144, 126, 341/154, 118

(56) References Cited

U.S. PATENT DOCUMENTS 5,870,049 * 2/1999 Huang ................................... 341/144
6,130,632 * 10/2000 Opris .................................... 341/120

* cited by examiner

*Primary Examiner*—Brian Young
(74) *Attorney, Agent, or Firm*—Lowe Hauptman Gilman & Berner, LLP

(57) ABSTRACT

A current source layout arrangement for a current-mode D/A converter is disclosed. The D/A converter has a plurality of large current sources and a plurality of small current sources. Each large current source has a plurality of unit current sources, and the large current sources are divided into a plurality of groups, each consisting of two large current sources, for being symmetrically arranged. The unit current sources of two large current sources in one group are interlacingly interposed. Each small current source has at least one current source unit. The unit current sources of the small current sources are diagonally inserted into the arrangement of the unit current sources of the large current sources.

7 Claims, 7 Drawing Sheets

| A 1 | DUMMY |  |
|---|---|---|
| A 5 | B 3-8 | A 3 |
| A 9 | B 2-4 | A 7 |
| A 13 | B 3-7 | A 11 |
| A 17 | B 1-2 | A 15 |
| A 21 | B 3-6 | A 19 |
| A 25 | B 2-3 | A 23 |
| A 29 | B 3-5 | A 27 |
| A 31 | B 0-1 | A 30 |
| A 28 | B 3-4 | A 26 |
| A 24 | B 2-2 | A 22 |
| A 20 | B 3-3 | A 18 |
| A 16 | B 1-1 | A 14 |
| A 12 | B 3-2 | A 10 |
| A 8 | B 2-1 | A 6 |
| A 4 | B 3-1 | A 2 |

FIG. 4

LAYOUT ARRANGEMENT OF CURRENT SOURCES IN A CURRENT-MODE DIGITAL-TO-ANALOG CONVERTER

BACKGROUND OF THE INVENTION

1. Field of the Invention

The present invention relates to the field of digital-to-analog (D/A) converters and, more particularly, to the layout arrangement of current sources in a current-mode D/A converter.

2. Description of Related Art

Current-mode D/A converters have become popular in recent years due to the increase in digital audio and video applications. A schematic circuit diagram of a conventional 8-bit D/A converter is shown in FIG. 7. This D/A converter has two 4-to-15 converters 71 and 72 for converting an 8-bit input code, denoted by I0~I7, into a thermal code. The converter 71 converts the most significant bits (hereinafter abbreviated as MSB) 14~17 of the input code into 15 MSB outputs M1~M15. Also, the converter 72 converts the least significant bits (hereinafter abbreviated as LSB) I0~I3 of the input code into 15 LSB outputs L1~L15. These outputs M1~M15 and L1~L15 are referred to as the thermal code, which is characterized by the fact that only one of the outputs changes state when the input code is incremented so as to prevent a sudden change from occurring in output current.

Such a D/A converter further includes 15 MSB current sources 73 and 15 LSB current sources 74. Each of MSB current sources 73 corresponds to one of the MSB outputs M1~M15. The output of each MSB current source 73 is connected to a switch 731 which is turned on or off by a corresponding MSB output M1~M15, such that the output current from each of the MSB current sources 73 is controlled to be selectively output by the corresponding MSB output M1~M15. Similarly, each of LSB current sources 74 corresponds to one of the LSB outputs L1~L15. The output of each LSB current source 74 is connected to a switch 741 which is turned on or off by a corresponding LSB output L1~L15, such that the output current from each of the LSB current sources 74 is controlled to be selectively output by the corresponding LSB output L1~L15. Accordingly, the digital input code I0–I7 can be converted into a corresponding analog current $I_{out}$ for output.

Generally, one LSB current source 74 is implemented by a metal oxide semiconductor (MOS) transistor, and one MSB current source 73 is comprised of 16 MOS transistors for providing a larger output current. Therefore, the circuit layout of the current source transistors for the conventional D/A converter can be shown as in FIG. 8, wherein all the required transistors 81 are arranged in a 15×16 array. Each column of the array includes 16 transistors 81 electrically added together to form a MSB current source 73, and fifteen transistors 81 in the rightmost column are provided to be the 15 LSB current sources 74, respectively.

In such a circuit layout, the transistors of the MSB current sources 73 are sequentially arranged from left to right, which may result in producing gradients in the transistor values of the transistors due to process inaccuracies. Therefore, a known DNL (Differential Non-Linearity) error is likely to be caused by the gradients. Such a DNL error negatively affects the accuracy and performance of the DIA converter.

To avoid the above DNL error, U.S. Pat. No. 5,568,145 for a "Current Source Layout Technique to Minimize Deviation" granted to Reynolds is disclosed to have an array of current source cells, wherein the LSB current source cells are physically arranged centrally with respect to the MSB current source cells, and the cells of each MSB current source are electrically added together and physically located along a laterally diagonal path. Although such a circuit layout may eliminate the DNL error caused by the gradients, it is only suitable to an even-bit D/A converter because the number of all the LSB current sources has to be approximately equal the number of the cells of one MSB current source. In other words, it is not applicable to the odd-bit D/A converters, such as 9-bit D/A converters, which are commonly used in audio/video products. Furthermore, because the cells of each MSB current source are added and located in a laterally diagonal manner, the wire connection of the circuit layout is difficult and thus the layout area is increased.

Therefore, it is desired to have an improved layout arrangement of current cells in a D/A converter to overcome the aforementioned drawbacks.

SUMMARY OF THE INVENTION

It is an object of the present invention to provide a current-mode D/A converter, wherein its current source layout is applicable to a digital input with an odd number of bits.

It is another object of the present invention to provide a current-mode D/A converter, wherein its current source layout can eliminate errors caused by process inaccuracies.

It is still another object of the present invention to provide a currentmode D/A converter, wherein the wire connection of its current source layout is easy and the layout area is significantly decreased.

To achieve the above objects, a current-mode D/A converter having a plurality of large current sources and a plurality of small current sources is provided for converting a digital input into an analog current output. Each large current source has a plurality of unit current sources. The large current sources are divided into a plurality of groups, each having two large current sources, for being symmetrically arranged. The unit current sources of two large current sources in one group are interlacingly interposed. Each small current source has at least one unit current source and the unit current sources of the small current sources are diagonally inserted into the unit current sources of the large current sources.

The above and other objects, features and advantages of the present invention will become apparent from the following detailed description taken with the accompanying drawings.

BRIEF DESCRIPTION OF THE DRAWINGS

FIG. 4 schematically illustrates a layout arrangement of the current sources for the current-mode D/A converter in accordance with a preferred embodiment of the present invention;

DETAILED DESCRIPTION OF THE PREFERRED EMBODIMENTS

Figure 1:
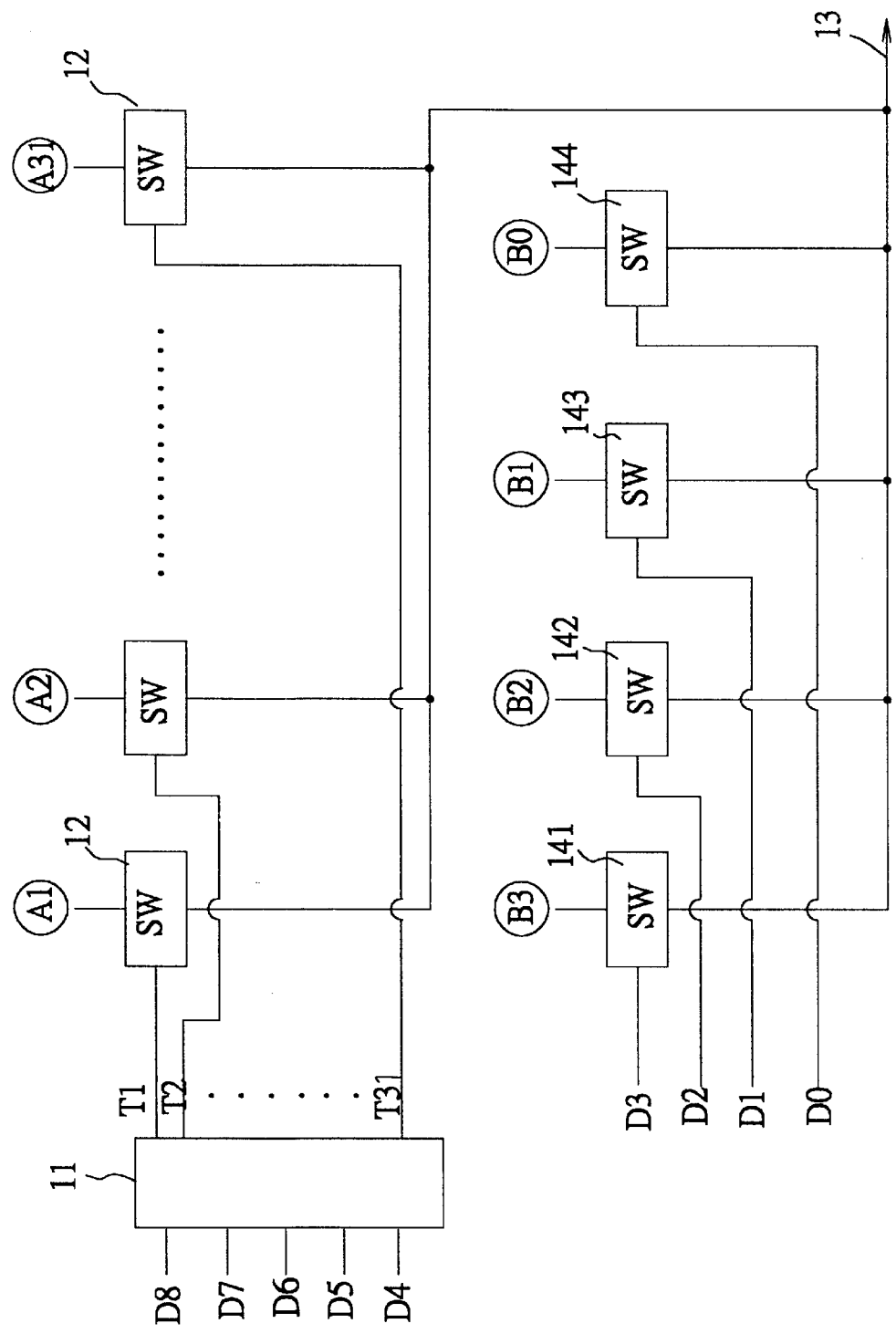
FIG. 1 is a circuit diagram of a current-mode D/A converter in accordance with a preferred embodiment of the present invention.

FIG. 1 shows a preferred embodiment of a current-mode D/A converter in accordance with the present invention, which is provided to convert a 9-bit digital input to an analog current output. The most significant bits (MSB) of the digital input, denoted by D4~D8, are transformed by a converter into a 31-bit thermal code, denoted by T1~T31. The thermal code outputs T1~T31 are used to control thirty-one switches 12, respectively, each switch 12 being connected to one of thirty-one 16-unit current sources, denoted by A1~A31, and each 16-unit current source A1~A31 including sixteen unit current sources, such that, when a switch 12 is turned on, current from a corresponding MSB current source A1~A31 is output to the output terminal 13.

The least significant bits (LSB) of the digital input, denoted by D0~D3, are directly used to control four switches 141~144, respectively. The four switches 141~144 are connected to an 8-unit current source B0, a 4-unit current source B3, a 2-unit current source B2, and an unit current source B1, respectively, wherein an N-unit current source is comprised of N unit current sources (N=8, 4, 2). As such, when one of the switches 141~144 is turned on, current from a corresponding current source B3~B0 is output to the output terminal 13 and summed with the aforementioned current from a 16-unit current source A1~A31. As a result, the digital input D0~D8 can be converted into an analog current output.

Figure 2:
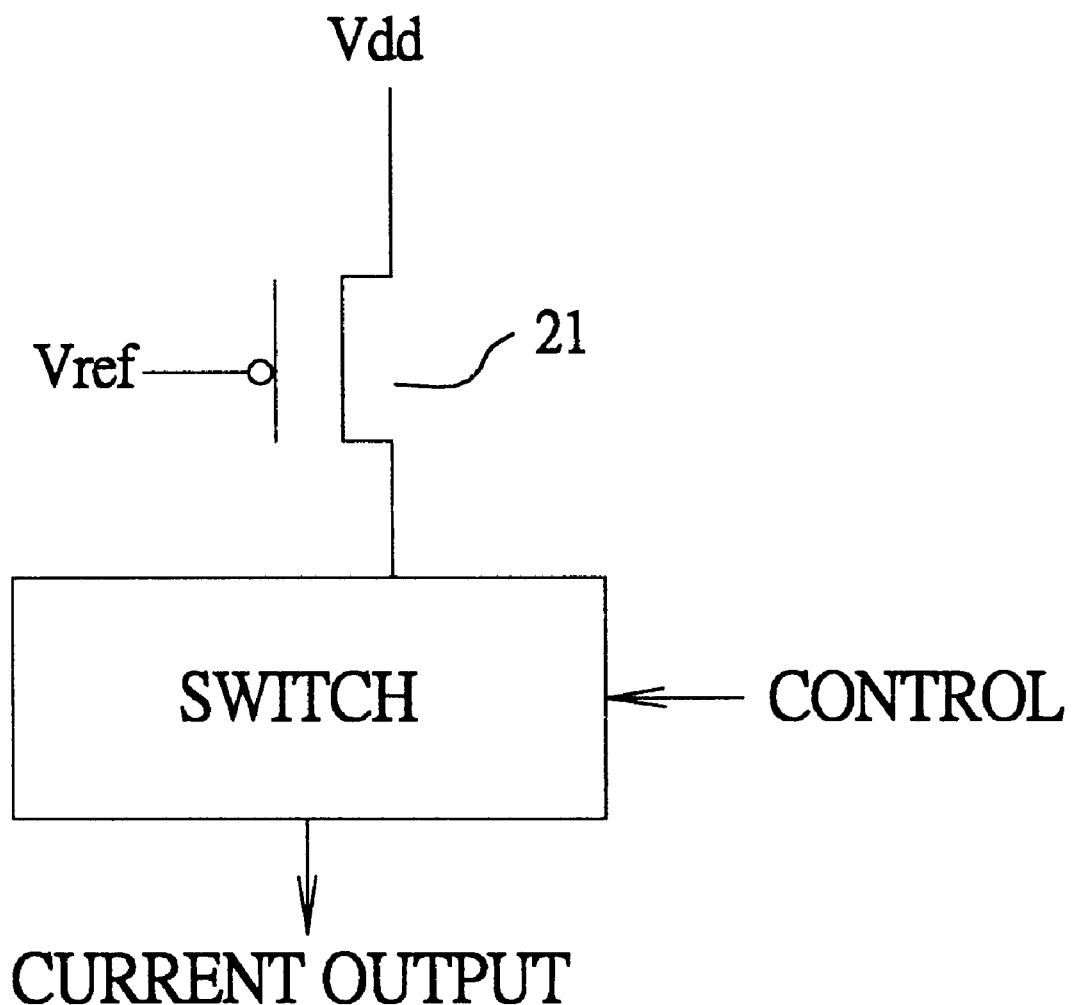
FIG. 2 is a circuit diagram showing a unit current source.
Figure 3:
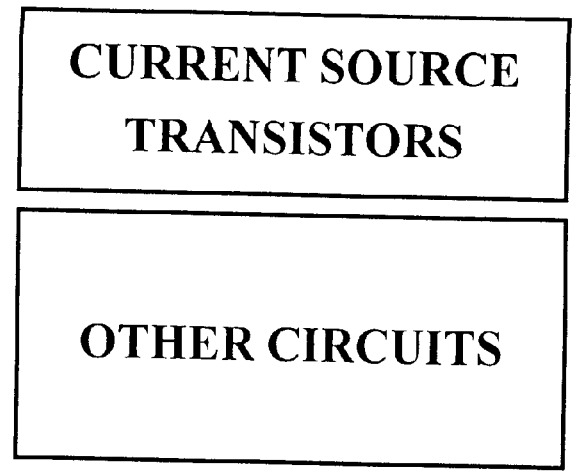
FIG. 3 schematically illustrates a layout profile of the current-mode D/A converter in accordance with a preferred embodiment of the present invention.
Figure 6:
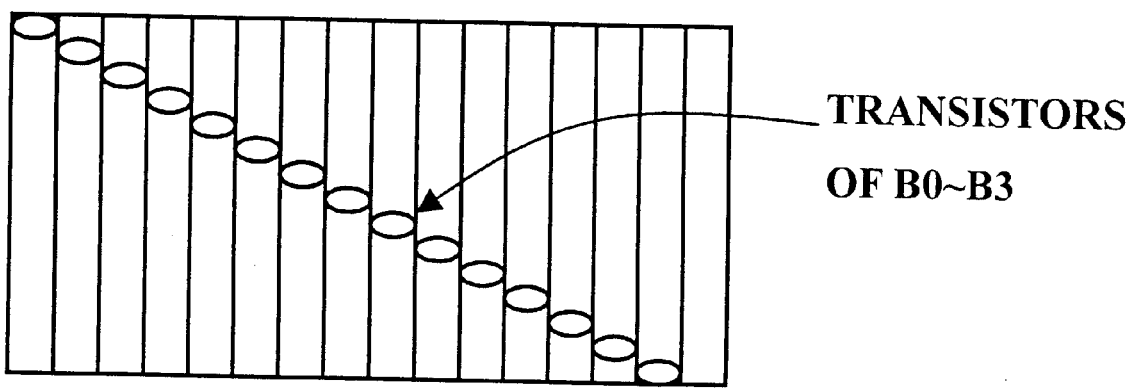
FIG. 6 schematically illustrates the overall current source layout arrangement of the current-mode D/A converter in accordance with a preferred embodiment of the present invention.

Each unit current source can be implemented by a MOS transistor 21, as shown in FIG. 2. The entire circuit layout of the D/A converter is illustrated in FIG. 3, wherein the MOS transistors of all current sources A1~A31 and B0~B3 are grouped together. FIG. 4 shows the layout arrangement of the above current sources A1~A31 and B0~B3, wherein the 16-unit current sources A1~A31 are divided into sixteen groups, each typically having two current sources A1~A31. These current source groups are symmetrically arranged based on the encoding order of corresponding thermal codes. In this preferred embodiment, as shown in FIG. 4, each group is comprised of either two even-numbered current sources (e.g., A2 and A4, A6 and A8, etc.) or two odd-numbered current sources (e.g., A3 and A5, A7 and A9, etc.), and the current source groups are arranged in an inward manner based on the labeled numbers of the current sources. A dummy current source, denoted by DUMMY, is provided to correspond to the 16-unit current source Al, which cannot match with another one, to make up a group. In detail, the first group consisting of current sources DUMMY and A4 is located in the rightmost position. The second group consisting of current sources A2 and A4 is located in the leftmost position. The third group consisting of current sources A3 and A5 is located in the second to leftmost position. The fourth group consisting of current sources A6 and A8 is located in the second to rightmost position. Subsequently, the remaining groups are located and the sixteen current source groups are arranged in an inward manner, such that uneven current outputs from current sources can be eliminated by an averaging effect, thereby improving the INL (Integral Non-Linearity) of the layout. Further, the fifteen MOS transistors, denoted by B3-1~B3-8, B2-1~B2-4, B1-1, Bl-2, and B0-1, of the current sources B3, B2, B1 and BO are inserted into the arrangement of fifteen current source groups (except the first group) based on a predetermined order.

Figure 5:
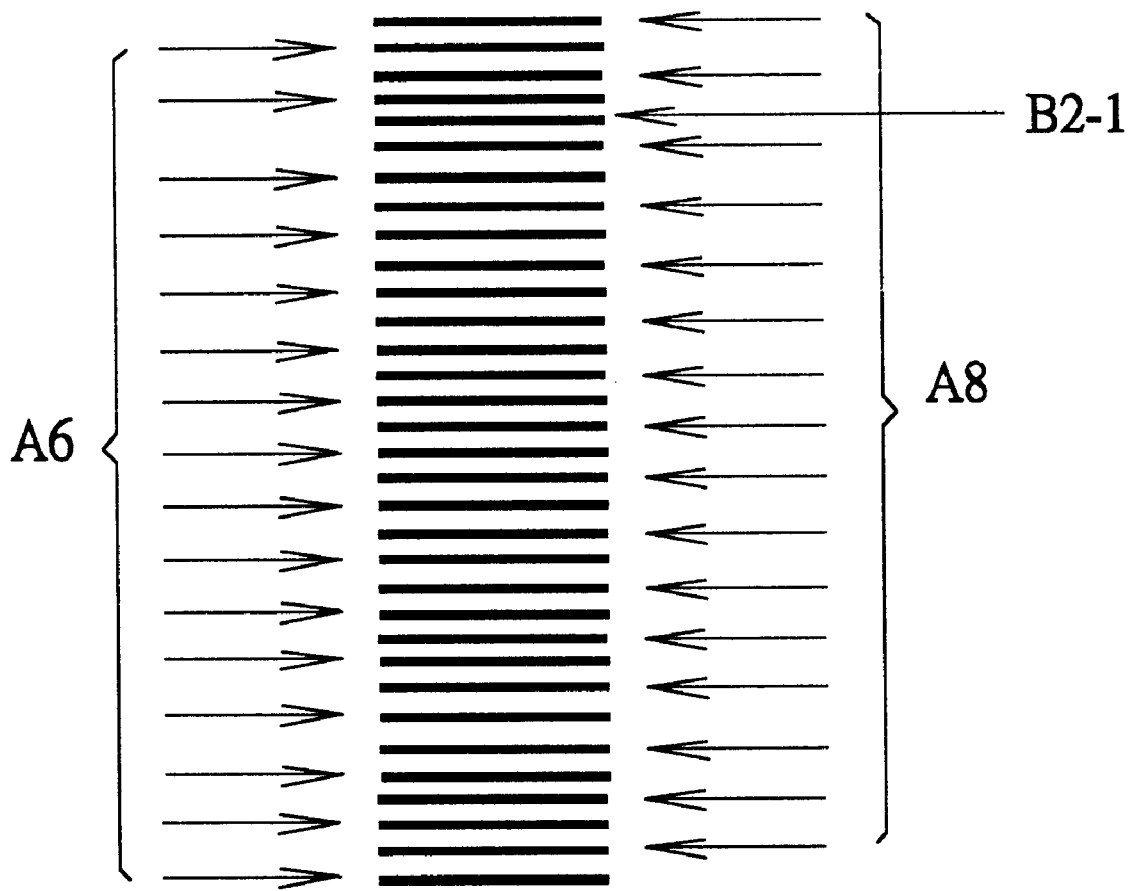
FIG. 5 shows the detailed layout arrangement of one straight-shaped layout shown in FIG. 4.
Figure 7:
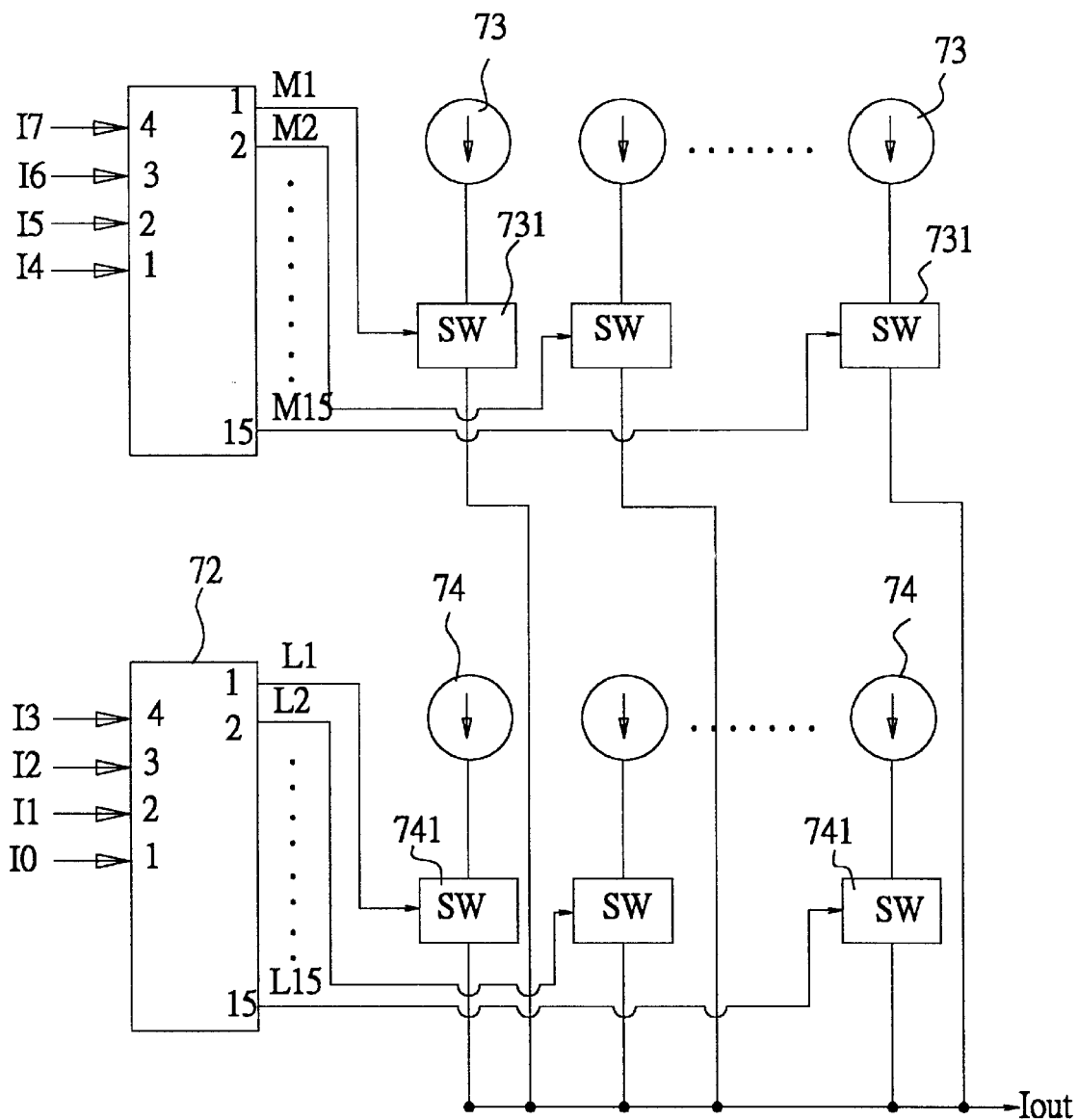
FIG. 7 is a circuit diagram of a conventional D/A converter.
Figure 8:
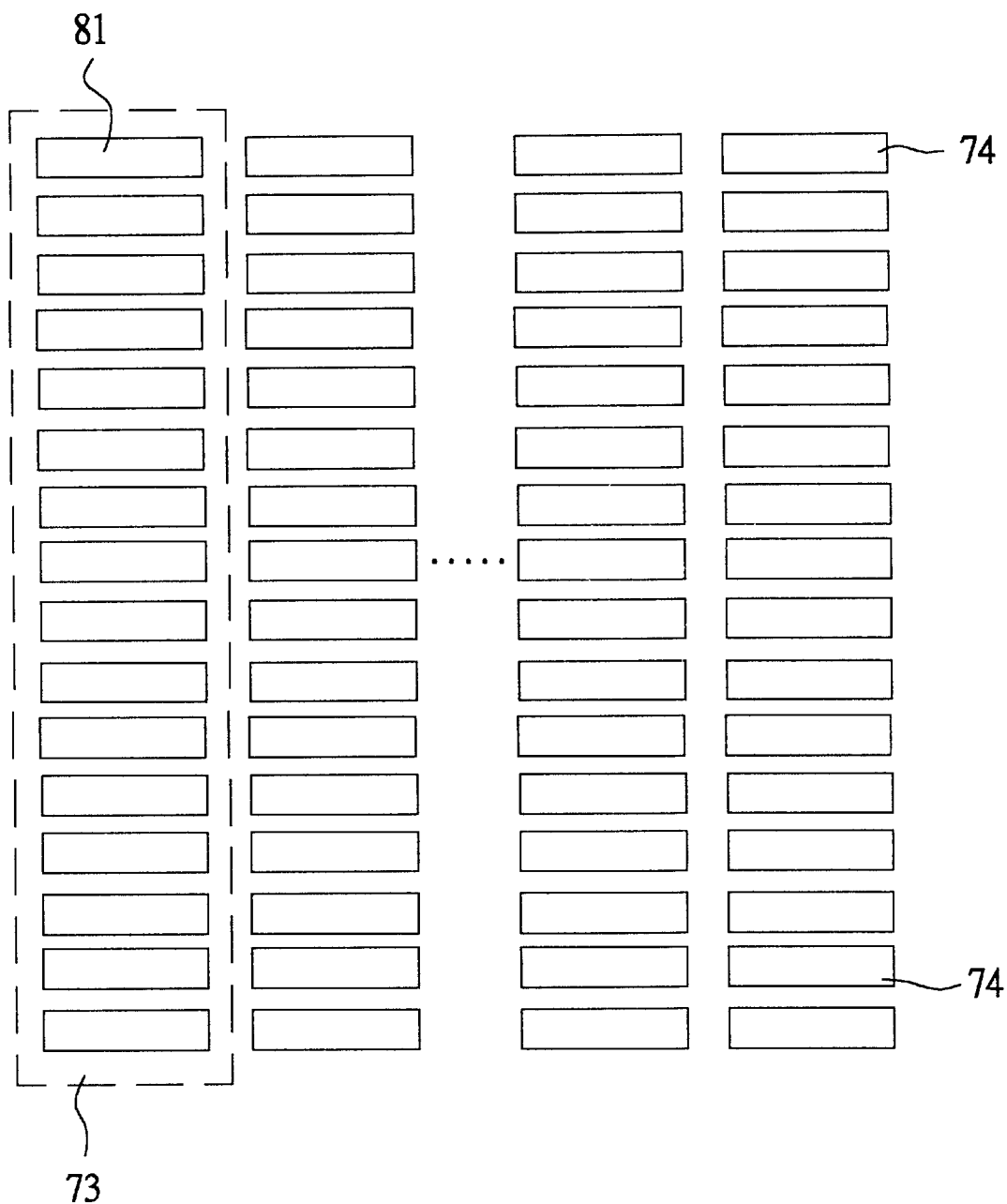
FIG. 8 schematically shows a conventional current source layout arrangement.

In the layout arrangement of the D/A converter, the actual layout of each current source group is shown in FIG. 5, wherein the group consisting of current sources A6 and A8, and transistor B2-1 are provided in this exemplary straight-shaped layout. As shown, the sixteen MOS transistors of the current source A6, and the sixteen MOS transistors of the current source A8, are interlacingly interposed, similar to the fingers when a person grips his/her hands together. That is, one transistor of current source A6 is located between two adjacent transistors of current source A8, and vice versa. Furthermore, the MOS transistor B2-1 is inserted in the arrangement of the MOS transistors of the current sources A6 and A8. The layout of the fifteen MOS transistors B3-1~B3-8, B2-1~B2-4, Bl-l, B1-2, and B0-1 is illustrated in FG. 6, wherein these MOS transistors are diagonally inserted into the MOS transistors of the thirty-one 16-unit current sources. Accordingly, the MOS transistors of the current sources can be distributed uniformly. Furthermore, because the MOS transistors of the two 16-unit current sources in one group are interlacingly interposed, the uniformity of transistor layout is enhanced. Even if the digital input has an odd number of bits, the layout uniformity can be maintained, thereby entirely eliminating the errors caused by process inaccuracies. In addition, because the MOS transistors of each 16-unit current source are arranged in a straight path, the resultant wire connection for a circuit layout is easy and the layout area is thus significantly reduced.

While the invention herein disclosed has been described by means of specific embodiments, numerous modifications and variations, such that the least significant bits of the digital input can also be converted to a thermal code, could be made thereto by those skilled in the art without departing from the scope and spirit of the invention set forth in the claims.

What is claimed is:

1. A current-mode digital-to-analog converter for converting a digital input into an analog current output, comprising:

a plurality of large current sources, each having a plurality of unit current sources, wherein said large current sources are divided into a plurality of current source groups, each having two large current sources, for being symmetrically arranged, and the unit current sources of two large current sources in one current source group are interlacingly interposed; and a plurality of small current sources, each having at least one unit current source, the unit current sources of said plurality of small current sources being diagonally inserted into the unit current sources of said large current sources.

2. The current-mode digital-to-analog converter as claimed in claim 1, wherein said plurality of large current sources are symmetrically arranged based on an encoding order of a corresponding digital input.

3. The current-mode digital-to-analog converter as claimed in claim 2, wherein said plurality of large current sources are arranged in a manner that each current source group has either two even-numbered large current sources or two odd-numbered current sources and said plurality of current source groups are arranged inwardly.

4. The current-mode digital-to-analog converter as claimed in claim 1, further comprising a dummy current source being matched with one of said plurality of large current sources to form a current source group.

5. The current-mode digital-to-analog converter as claimed in claim 1, wherein said digital input is comprised of an odd number of bits whose least significant bits are provided to control said small current sources, and whose most significant bits are provided to control the large current sources.

6. The current-mode digital-to-analog converter as claimed in claim 1, wherein each of said unit current sources is implemented by a metal oxide semiconductor transistor.

7. The current-mode digital-to-analog converter as claimed in claim 6, wherein the metal oxide semiconductor transistors of said unit current sources are grouped together in a circuit layout.

\* \* \* \* \*